US010453929B2

(12) United States Patent
Laforet et al.

(10) Patent No.: US 10,453,929 B2
(45) Date of Patent: Oct. 22, 2019

(54) METHODS OF MANUFACTURING A POWER MOSFET

(71) Applicant: Infineon Technologies Austria AG, Villach (AT)

(72) Inventors: David Laforet, Villach (AT); Oliver Blank, Villach (AT); Michael Hutzler, Villach (AT); Cedric Ouvrard, Villach (AT); Ralf Siemieniec, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/584,063

(22) Filed: May 2, 2017

(65) Prior Publication Data

US 2017/0236910 A1 Aug. 17, 2017

Related U.S. Application Data

(62) Division of application No. 14/793,779, filed on Jul. 8, 2015, now Pat. No. 9,680,004.

(30) Foreign Application Priority Data

Jul. 14, 2014 (DE) .................. 10 2014 109 846

(51) Int. Cl.
*H01L 21/336* (2006.01)
*H01L 29/40* (2006.01)
(Continued)

(52) U.S. Cl.
CPC .......... *H01L 29/407* (2013.01); *H01L 29/404* (2013.01); *H01L 29/4236* (2013.01);
(Continued)

(58) Field of Classification Search
None
See application file for complete search history.

(56) References Cited

U.S. PATENT DOCUMENTS

2007/0132013 A1  6/2007  Banerjee et al.
2010/0084706 A1* 4/2010  Kocon ............... H01L 21/3065
                                                    257/330
(Continued)

FOREIGN PATENT DOCUMENTS

CN   101536164 A   9/2009
CN   103137494 A   6/2013
(Continued)

*Primary Examiner* — Hung K Vu
(74) *Attorney, Agent, or Firm* — Murphy, Bilak & Homiller, PLLC

(57) ABSTRACT

A method of manufacturing a power metal oxide semiconductor field effect transistor includes: forming a field electrode in a field plate trench in a main surface of a semiconductor substrate; forming a gate trench in the main surface, the gate trench extending in a first direction parallel to the main surface; and for a gate electrode in the gate trench, the gate electrode being made of a gate electrode material that comprises a metal. The field plate trench is formed to have an extension length in the first direction which is less than double of an extension length of the field plate trench in a second direction, the second direction being perpendicular to the first direction.

16 Claims, 10 Drawing Sheets

(51) Int. Cl.
*H01L 29/78* (2006.01)
*H01L 29/49* (2006.01)
*H01L 29/66* (2006.01)
*H01L 29/423* (2006.01)

(52) U.S. Cl.
CPC ...... *H01L 29/4238* (2013.01); *H01L 29/4966* (2013.01); *H01L 29/66734* (2013.01); *H01L 29/7813* (2013.01)

(56) References Cited

U.S. PATENT DOCUMENTS

2011/0254086 A1   10/2011  Hsieh
2012/0061753 A1*  3/2012  Nishiwaki ............ H01L 29/407
                                                257/331

FOREIGN PATENT DOCUMENTS

CN       103811555 A     5/2014
DE     102005052734 B4   2/2012

* cited by examiner

METHODS OF MANUFACTURING A POWER MOSFET

PRIORITY CLAIM

This application is a Divisional of U.S. application Ser. No. 14/793,779 filed on 8 Jul. 2015, which in turn claims priority to German Patent Application No. 10 2014 109 846.3 filed on 14 Jul. 2014, the content of both of said applications incorporated herein by reference in their entirety.

BACKGROUND

Power transistors commonly employed in automotive and industrial electronics require a low area-specific on-resistance ($R_{on} \times A$) while securing a high voltage blocking capability. For example, a MOS ("metal oxide semiconductor") power transistor should be capable, depending upon application requirements, to block drain-to-source voltages $V_{ds}$ of some tenths to some hundreds or thousands of volts. MOS power transistors typically conduct very large currents which may be up to some hundreds of amperes at typical gate-source voltages of about 2 to 20 V.

The use of power MOSFETs ("metal oxide semiconductor field effect transistors") with charge compensation using an isolated field-plate or field-electrode offers an opportunity to reduce the area-specific on-resistance of such a device.

Generally, novel concepts of power MOSFETs which result in improved device characteristics are investigated.

It is particularly an object to provide an improved power MOSFET based on charge compensation using field electrodes which can be shrunk to smaller gate trench widths.

SUMMARY

According to an embodiment, a power metal oxide semiconductor field effect transistor comprises a gate electrode in a gate trench in a main surface of a semiconductor substrate, the gate trench extending parallel to the main surface, and a field electrode in a field plate trench in the main surface. The field plate trench has an extension length in a first direction which is less than double and more than half of an extension length of the field plate trench in a second direction perpendicular to the first direction, the first and the second directions being parallel to the main surface. The gate electrode comprises a gate electrode material, the gate electrode material comprising a metal.

According to a further embodiment, a power metal oxide semiconductor field effect transistor comprises a gate electrode in a gate trench in a main surface of a semiconductor substrate, the gate trench extending parallel to the main surface, and a field electrode in a field plate trench in the main surface. The field plate trench has an extension length parallel to the main surface which is less than a depth of the field plate trench. The gate electrode comprises a gate electrode material, the gate electrode material comprising a metal.

According to an embodiment, a method of manufacturing a power metal oxide semiconductor field effect transistor comprises forming a field electrode in a field plate trench in a main surface of a semiconductor substrate, forming a gate trench in the main surface, the gate trench extending in a first direction parallel to the main surface, and forming a gate electrode in the gate trench. The field plate trench is formed to have an extension length in the first direction which is less than double of an extension length of the field plate trench in a second direction, the second direction being perpendicular to the first direction. The gate electrode is made of a gate electrode material that comprises a metal.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1A:
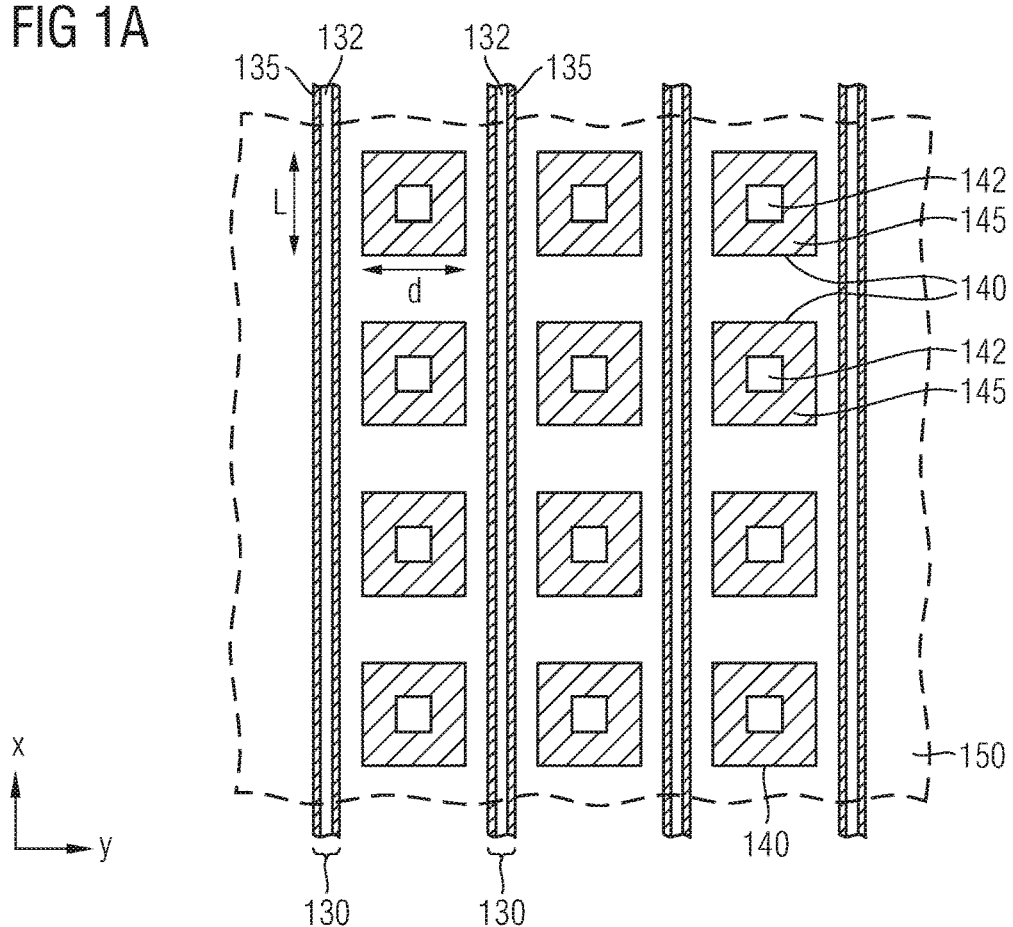
FIG. 1A shows a plan view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

FIG. 1A shows a plan view of an example of a semiconductor device according to an embodiment. The semiconductor device comprises a gate electrode 132 in a gate trench 130 in a main surface of a semiconductor substrate. The semiconductor device further comprises a field electrode 142 in a field plate trench 140 in the main surface of the semiconductor substrate. The field plate trench 140 has an extension length L in a first direction (e.g. the x direction) parallel to the main surface. The extension length in the first direction is less than the double of an extension length d in a second direction (e.g. the y direction) perpendicularly to the first direction. The extension length L in the first direction is more than a half of the extension length d in the second direction. The gate electrode 132 comprises a gate electrode material and the gate electrode material comprises a metal. According to the shown configuration, the field electrodes 142 and the gate electrode 132 are disposed in separate trenches.

As will be explained later with reference to FIG. 1B, the semiconductor device illustrated in FIG. 1A implements a vertical MOSFET, in which upon application of a suitable voltage to the gate electrode 132 a conductive inversion channel may be formed in a body region adjacent to the gate electrode 132, the conductive channel having a component in the vertical direction, i.e. the z direction.

The field plate trench 140 extends in a third or vertical direction, i.e. the z direction perpendicular to the depicted plane of the drawing of FIG. 1A. According to an embodiment, a maximum extension length L, d of the field plate trench 140 in a plane parallel to a main surface of the substrate is smaller than a maximum extension length t in the z direction. For example, a ratio of a maximum horizontal extension length L, d with respect to a maximum vertical extension length t of the field plate trench 140 may be in a range from 0.05 to 0.5. According to a further embodiment, the field plate trench 140 may have a needle shape in which the ratio of the maximum horizontal extension length L, d of the trench with respect to a maximum vertical extension length t is in a range from 0.05 to 0.5. The sidewalls of the field plate trench 140 may not be exactly perpendicular with respect to the main surface of the semiconductor substrate but may be curved.

Due to the specific shape of the field plate trenches, a greater portion of the drift zone of the power MOSFET per field plate trench area may be charge compensated compared with a case in which the field plate trench has a stripe-shaped shape. As a result, the area needed for the field plate trench is reduced so that more effective area may be used for charge transport. In more detail, as is also illustrated in FIG. 1A, each of the field electrodes 142 may perform a charge-compensation with respect to the semiconductor material disposed adjacent with respect to the first direction (x direction) and the second direction (y direction).

On the other hand, each of the field electrodes 142 may be directly in contact with an external terminal e.g. a source terminal so that an external potential may be effectively applied to the field electrode 142.

Due to the architecture of the field plate trenches 140, the field electrode 142 of each single field plate may be electrically coupled directly to a source plate 150. This results in a very low resistive connection between all field electrodes and the source plate. As a consequence, the device may be switched in a very homogenous manner, since a locally occurring dynamic avalanche effect is avoided. Accordingly, a negative impact on the switching transient of the device may be avoided. As a result, lower switching losses and the complete avoidance of losses related to dynamic avalanche effects may be achieved. Hence, a higher switching frequency can be realized. At the same time, the drain-source voltage overshoot can be controlled by the specific resistance of the field plate material.

The field plate trench 140 may have a circular, annular, star-like, rectangular, hexagonal, rhombic or any other suitable polygonal shape in a cross-sectional view parallel to the main surface of the semiconductor substrate. The field electrode 142 is insulated from an adjacent drift zone by means of a field dielectric layer 145. The field dielectric layer may be disposed to entirely insulate the field electrode 142 from the adjacent substrate material as is, for example, shown in FIG. 1A. According to a further embodiment, the field dielectric layer 145 may only be disposed in a lower portion of the field plate trench 140, and the upper portion of the field electrode is in contact with the adjacent source region of the power MOSFET. For example, the field plate trenches 140 may have a diameter of 0.3 µm to 7 µm and may have a depth of 2 to 30 µm depending on the voltage class.

According to an embodiment, the gate trenches 130 may run in the first direction. Mesas 137 are disposed between adjacent gate trenches 130. According to further embodiments, the gate trenches 130 may be arranged in different manners. For example, the gate trenches 130 may be arranged to form a grid-like pattern. The shape of the grid may be hexagonal or rectangular. For example, the gate trenches 130 may form a rectangular grid, with the field plate trenches 140 being disposed in the center of each of the mesas 137.

Due to the specific architecture of the semiconductor device illustrated in FIG. 1A, the width of the gate trench is significantly reduced in comparison with different concepts. For example, in the shown architecture, the width between two needle trenches measured along the second direction, e.g. the y direction, may be approximately 750 nm or less, depending on the voltage class of the power MOSFET. For example, a trench width to be employed in such a semiconductor device may be less than 200 nm.

It has been shown that the resistivity of polysilicon depends from the thickness of the polysilicon layer. Accordingly, forming a polysilicon layer to fill a trench having a width of less than 200 nm, results in a very large resistivity of the polysilicon. Due to the feature of the present embodiment, that the gate electrode comprises a metal, a small resistivity of the gate electrode material may be provided even if the trench width is reduced in comparison to known concepts. For example, such a metal gate may be used in combination with silicon oxide as the gate dielectric material 135. For example, the metal of the gate electrode 132 may be selected so as to provide a suitable work function for the employed doping of the body region of the semiconductor device, the thickness of the gate oxide layer and the threshold voltage range for which the device is used. Further, depending on the processing sequence to manufacture the power MOSFET, the metal should be selected so as to withstand a high temperature budget with a temperature up to 1000° C. In more detail, depending on the thickness of the oxides employed and the annealing steps which are performed during an ion implantation step, the metal of the gate electrode material should withstand a temperature of up to 1000° C. Moreover, the metal should be suitably integrable with an $SiO_2$ gate dielectric layer to provide a high reliability. According to embodiments, for example, a layer stack of a first and a second metal layer may be used. For example, the first metal layer may be a thin titanium nitride (TiN) layer and the second metal layer may be a thicker tungsten (W) layer. According to further embodiments, the first metal layer may also comprise any other metal nitride, for example, tantalum nitride (TaN) or molybdenum nitride (MoN). Moreover, the second metal layer may be an arbitrary metal silicide layer. For example, the second metal layer may be $WSi_x$, $TiSi_x$, $CoSi_x$, $MoSi_x$, $NiSi_x$, $TaSi_x$ or any other suitable silicide. The second metal layer may comprise a fully silicide layer or a partial silicide layer, e.g. a combination of a metal silicide layer comprising any of the silicides mentioned above with polysilicon layer.

FIG. 1A further shows a source plate 150 that may be electrically coupled to a source terminal and which may be arranged over the semiconductor substrate.

FIG. 1A shows an example of an arrangement of the field plate trenches 140. As is illustrated, a plurality of field plate trenches 140 are disposed adjacent to a gate trench 130 or between two adjacent gate trenches 130. The field plate trenches 140 may be disposed in a rectangular pattern in which the field plate trenches 140 are disposed in rows and columns. As is to be clearly understood, any other pattern may be used. For example, the field plate trenches 140 of every second column may be shifted by half a distance between adjacent field plate trenches 140 in the first direction so that a denser pattern of field plate trenches is achieved.

Figure 1B:
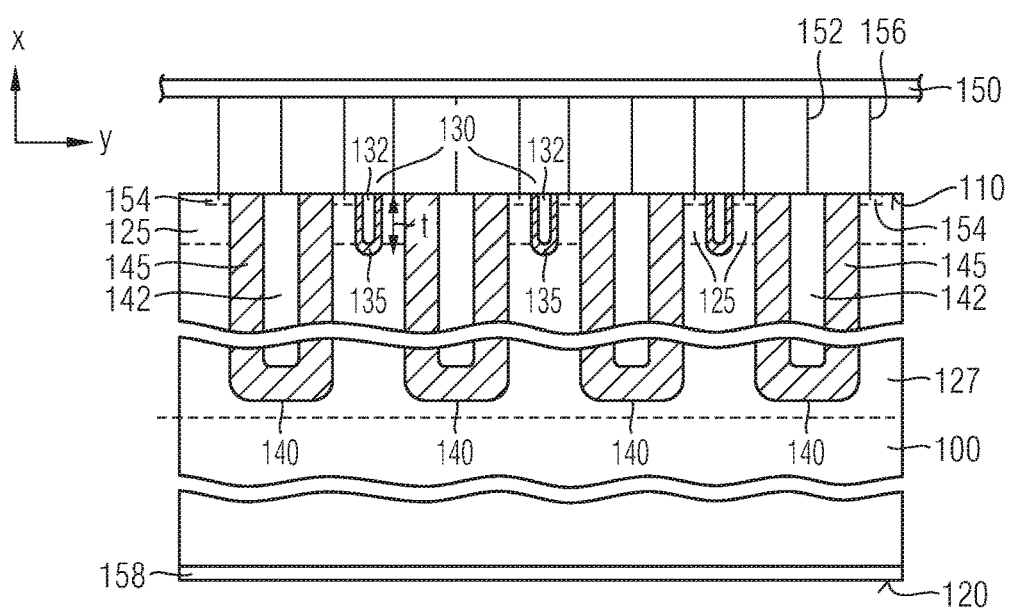
FIG. 1B shows a cross-sectional view of the semiconductor device illustrated in FIG. 1A.

FIG. 1B shows a cross-sectional view of the semiconductor device shown in FIG. 1A. For example, the cross-sectional view of FIG. 1B is taken along the y-direction so as to intersect a plurality of field plate trenches 140. Field plate trenches 140 are formed in a main surface 110 of a semiconductor substrate 100 so as to extend in a third direction (z-direction). Moreover, gate trenches 130 are formed in the main surface 110 of the semiconductor substrate. The field plate trenches 140 extend to a deeper depth than the gate trenches 130. The gate electrodes 132 are insulated from an adjacent substrate material by means of a gate dielectric 135. Further, the field electrodes 142 may be insulated from an adjacent drift zone 127 by means of the field dielectric 142. As has been discussed above, the field dielectric layer 142 may be formed so as to vertically extend along the entire sidewall of the field plate trench 140. According to further implementations, the field dielectric layer 145 may be disposed in a lower portion of the field plate trench and extend to a predetermined height. A source region 154 is disposed adjacent to the main surface 110 of the semiconductor substrate. The source region 154 may be of a first conductivity type. A drain region 158 of the first conductivity type may be disposed adjacent to a back side surface 120 of the semiconductor substrate 110. The drain region 158 may be electrically coupled to a drain terminal 159. A body region 125 of a second conductivity type may be disposed adjacent to the source region 154. The body region 125 is adjacent to the gate electrode 132. A drift zone 127 may be disposed between the body region 125 and the drain region 158, the drift zone 127 being disposed adjacent to the body region 125. The drift zone 127 may be of the first conductivity type.

In case of being switched on, a conductive inversion layer is formed at the boundary between the body region 125 and the gate dielectric layer 135. Accordingly, the transistor is in a conducting state from the source region 154 to the drain region 158 via the drain extension region or drift zone 127. In case of switching off, due to the effective field strength generated by the field electrode, carriers may be depleted from the drift zone 127. As a consequence, a current flow may be blocked at a high breakdown voltage. Accordingly, a doping concentration of the drift zone may be increased without impairing the breakdown characteristics, resulting in a reduced area-specific resistance of the semiconductor device.

A source plate 150 that may be connected to a source terminal may be disposed over the semiconductor substrate 100. The field electrodes 142 are electrically coupled to the source plate 150 via contact plugs 152. Further, the source regions 154 may be electrically coupled to the source plate 150 by means of source contacts. Further, the body region 125 may be electrically coupled to the source plate 150 in order to avoid a parasitic bipolar transistor which could otherwise be formed.

The semiconductor device illustrated in FIGS. 1A and 1B comprises a plurality of single transistor cells that are connected in parallel. In particular, the source regions 154 of any of the single transistor cells are electrically coupled to a common source plate 150 and the drain region 158 is coupled to a drain terminal. Moreover, the single gate electrodes 132 are electrically coupled to a common gate runner and may be connected to the same potential.

The semiconductor device illustrated in FIGS. 1A and 1B may be a vertical semiconductor device comprising a first load terminal contact (e.g. the source plate 150) at a first side of the semiconductor substrate and a second load terminal contact (e.g. the drain terminal 159) at a second side of the semiconductor substrate opposite to the first side, wherein the semiconductor device is configured to conduct a load current between the first and second load terminal contacts along a vertical direction perpendicular to the main surface.

FIGS. 2A to 2E illustrate steps of a method of manufacturing a power MOSFET according to an embodiment. Further, FIG. 2F illustrates portions of a power MOSFET that may be manufactured by the method illustrated in FIGS. 2A to 2E. A starting point for forming a power MOSFET according to an embodiment may be a semiconductor substrate including processed field plate trenches, further comprising p doped portions for forming the body region 125 and n+ doped regions for forming the source region 154. A gate trench 130 is formed in the main surface 110 of a semiconductor substrate 100. For example, the gate trench 130 may have a depth of approximately 600 to 1000 nm. Further, the width of the gate trench 130 measured in the y-direction, for example, may be less than 200 nm. According to an embodiment, the trench has been formed before performing the doping processes to form the body region and the source region. According to a further embodiment, the trench may be formed after forming these doped portions. A gate dielectric layer such as silicon oxide is formed on the sidewalls and the bottom side of the gate trench 130. For example, the gate electrode may be thermally grown. The thickness of the gate dielectric layer may be 20 to 100 nm, for example, 40 to 60 nm.

Figure 2A:
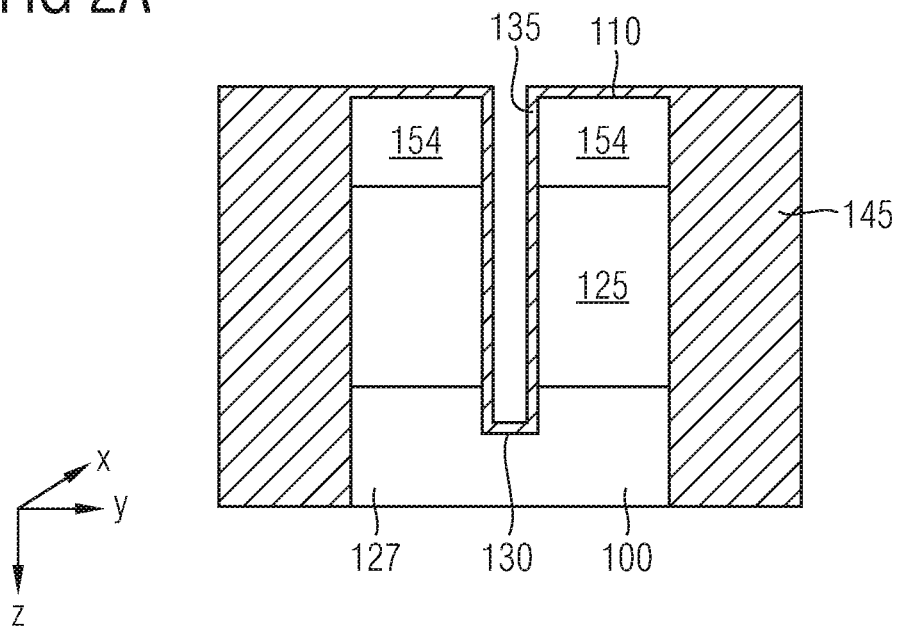
FIGS. 2A to 2E illustrate steps of a method of manufacturing a semiconductor device according to an embodiment.
Figure 2B:
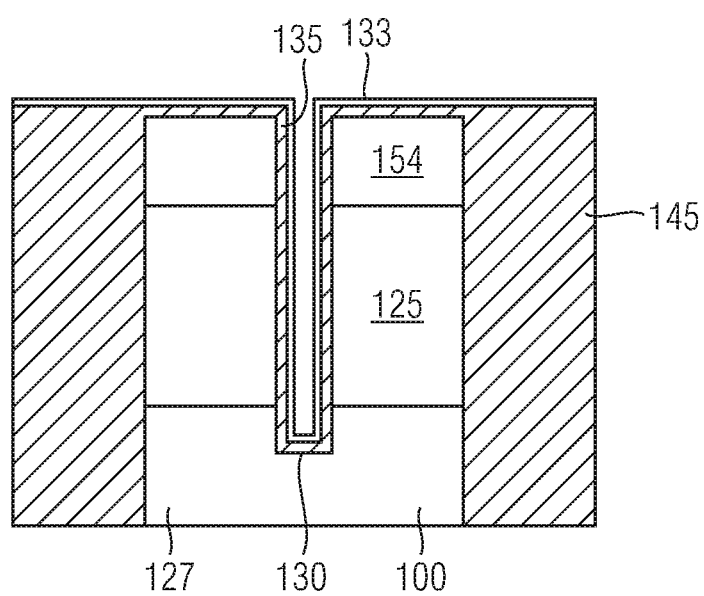

FIG. 2A shows an example of a resulting structure. Thereafter, the first metal layer 133 may be formed on the exposed surface of the semiconductor device. For example, the first metal layer which may be a barrier metal may comprise a metal nitride such as TiN, TaN, or WN. The first metal layer may be deposited using a PVD ("physical vapor deposition"), a CVD ("chemical vapor deposition") or an ALD ("atomic layer deposition") method. A thickness of the first metal layer may be approximately 5 to 15 nm, e.g. 9 to 11 nm. FIG. 2B shows an example of a resulting structure.

Optionally, an annealing step may be performed. Then, the second metal layer may be deposited. For example, tungsten (W) may be deposited using a CVD method. According to further embodiments another suitable material, for example, a fully or partially silicide poly-silicon layer may be used.

Figure 2C:
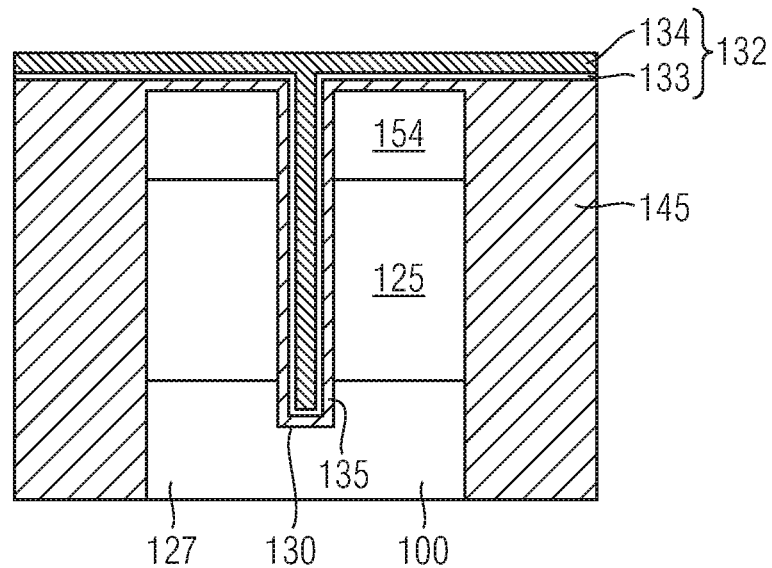

FIG. 2C shows an example of a resulting structure. Thereafter, a CMP (chemical-mechanical polishing) step may be performed so as to stop on the oxide layer 136.

Figure 2D:
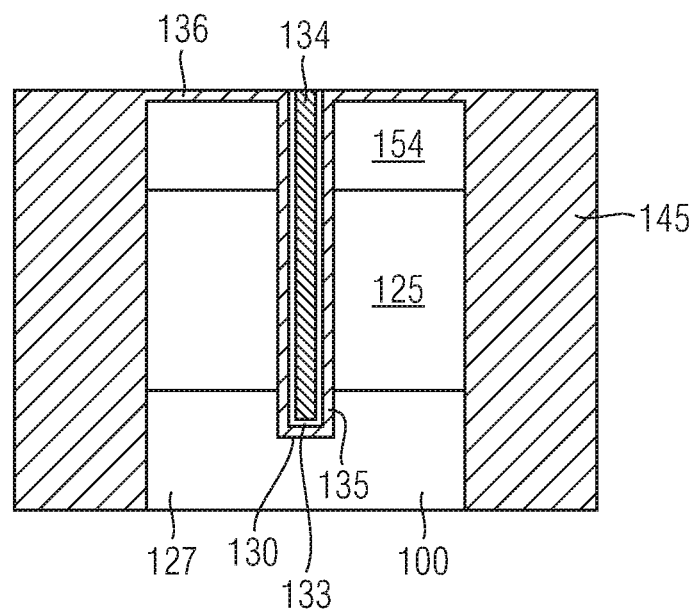
Figure 2E:
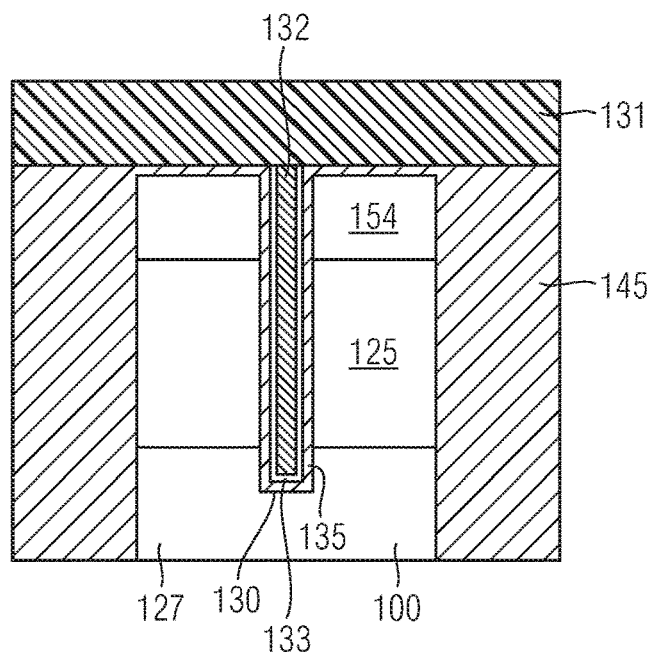
Figure 2F:
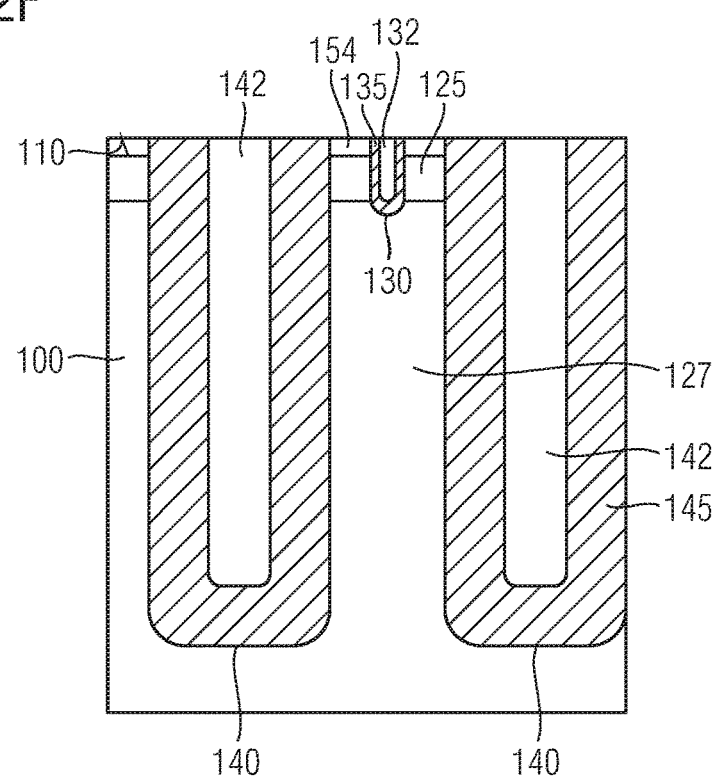
FIG. 2F shows a cross-sectional view of components of a semiconductor device according to an embodiment.

FIG. 2D shows an example of a resulting structure. Thereafter, a power metal layer 131 may be formed over the resulting surface so as to be in contact with the gate electrode material of the gate electrode 132. FIG. 2E shows an example of a resulting structure.

FIG. 2F illustrates further components of the semiconductor device that may be manufactured using the method illustrated with reference to FIGS. 2A to 2E.

Figure 3A:
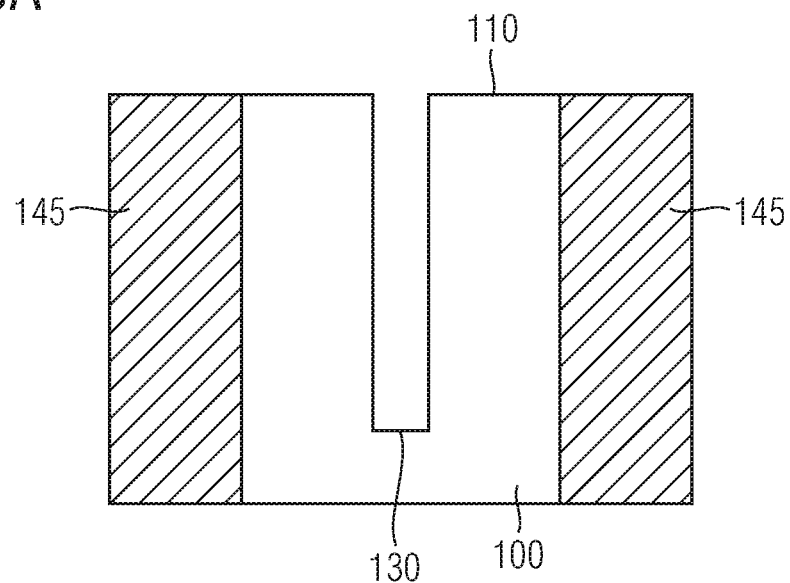
FIGS. 3A to 3D illustrate steps of a further embodiment of a method of manufacturing a semiconductor device.
Figure 3B:
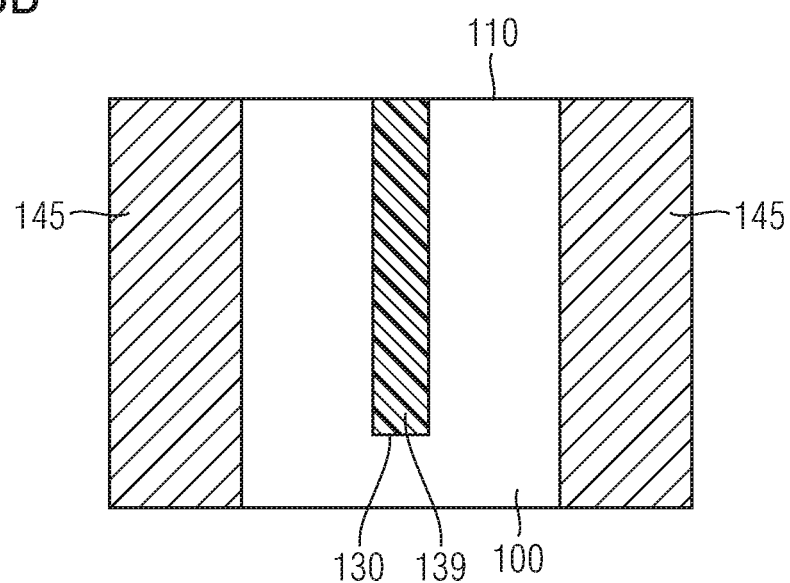
Figure 3C:
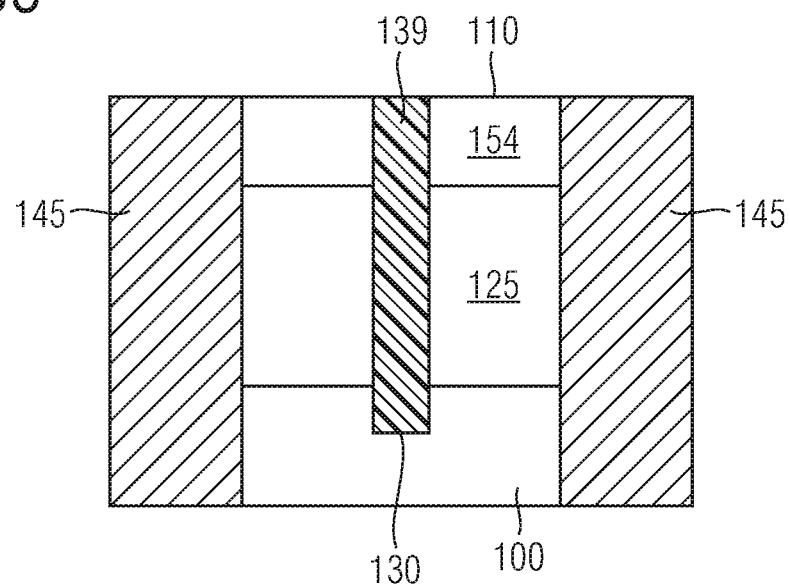
Figure 3D:
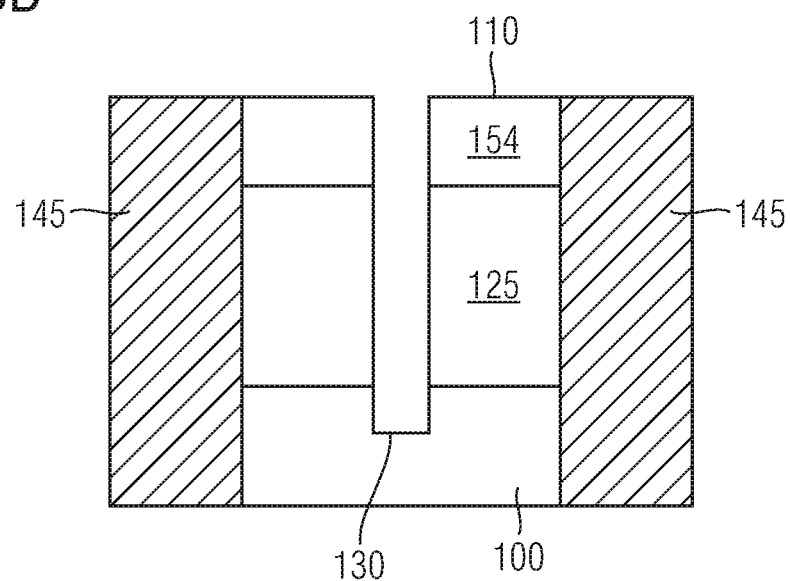

FIGS. 3A to 3D illustrate steps that may be performed according to an option before performing the method illustrated in FIGS. 2A to 2E. The process starts with field plate trenches including a field dielectric layer 145 and the field electrode 142 being formed in the main surface 110 of a semiconductor substrate 100. Gate trenches 130 are formed in the main surface 110, e.g. by a photolithographic method followed by an etching step. Then, a dummy material 139 is filled in the gate trenches 130, followed by a CMP step. For example, the dummy material may be any material that may withstand high temperatures and which may be selectively removed from the gate trenches 130 after performing the following processing steps. Examples of the dummy material 139 may comprise polysilicon. FIG. 3B shows an example of a resulting structure. Thereafter, doping steps are performed so as to define the source region 154, the body region 125 and the drain region 158. FIG. 3C shows an example of a resulting structure. Then, the dummy material 139 is removed from the gate trench 130 and the processing steps illustrated in FIGS. 2A to 2E may be performed.

Figure 4:
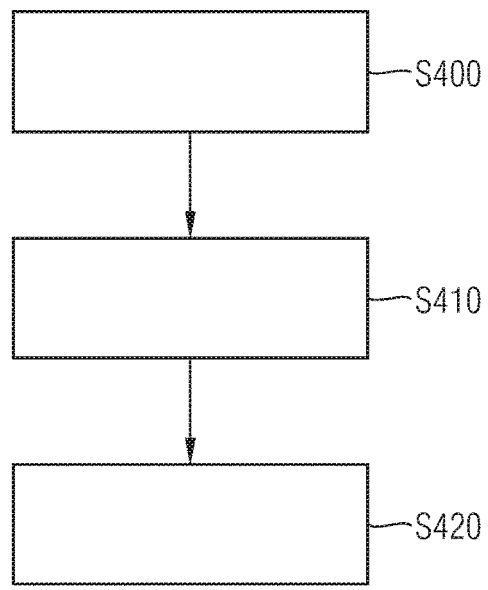
FIG. 4 summarizes a method of manufacturing a semiconductor device according to an embodiment.

FIG. 4 summarizes steps of a method of manufacturing a power MOSFET according to an embodiment.

A method of manufacturing a power MOSFET (metal oxide semiconductor field effect transistor) comprises forming a field electrode (S400) in a field plate trench in a main surface of a semiconductor substrate, forming a gate trench (S410) in the main surface, the gate trench extending in a first direction parallel to the main surface, and forming a gate electrode (S420) in the gate trench, wherein the field plate trench is formed to have an extension length in the first direction, the extension length being less than the double of an extension length in a second direction, perpendicularly to the first direction, and the gate electrode is made of a gate electrode material, the gate electrode material comprising a metal.

Figure 5A:
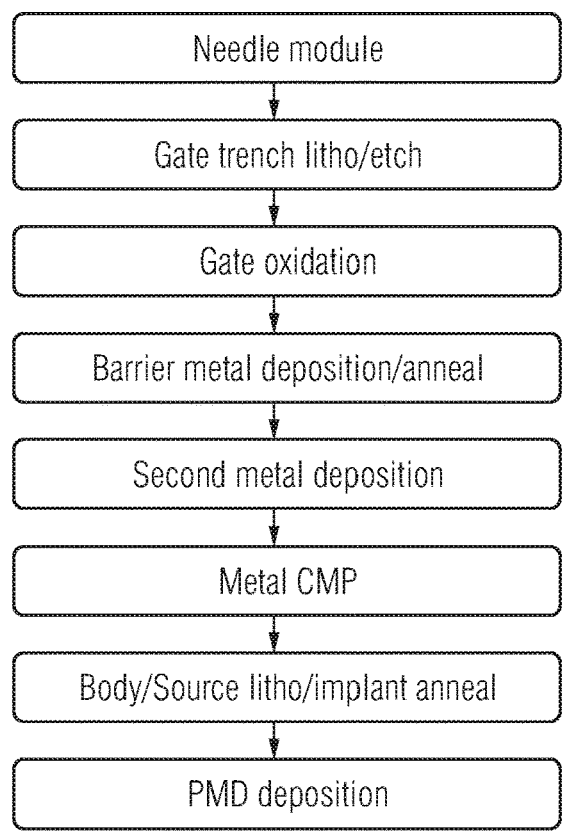
FIGS. 5A to 5C illustrate different methods of manufacturing a semiconductor device.

The method may be implemented in various manners. For example, as is illustrated in FIG. 5A, after forming the field plate trenches, the gate trenches may be etched, the gate oxide layer may be formed and thereafter, the metal filling for forming the gate electrode 132 may be provided. Thereafter, ion implantation steps may be performed so as to dope the body region and the source region, followed by an annealing process. Thereafter, the power metallization layer may be deposited.

Figure 5B:
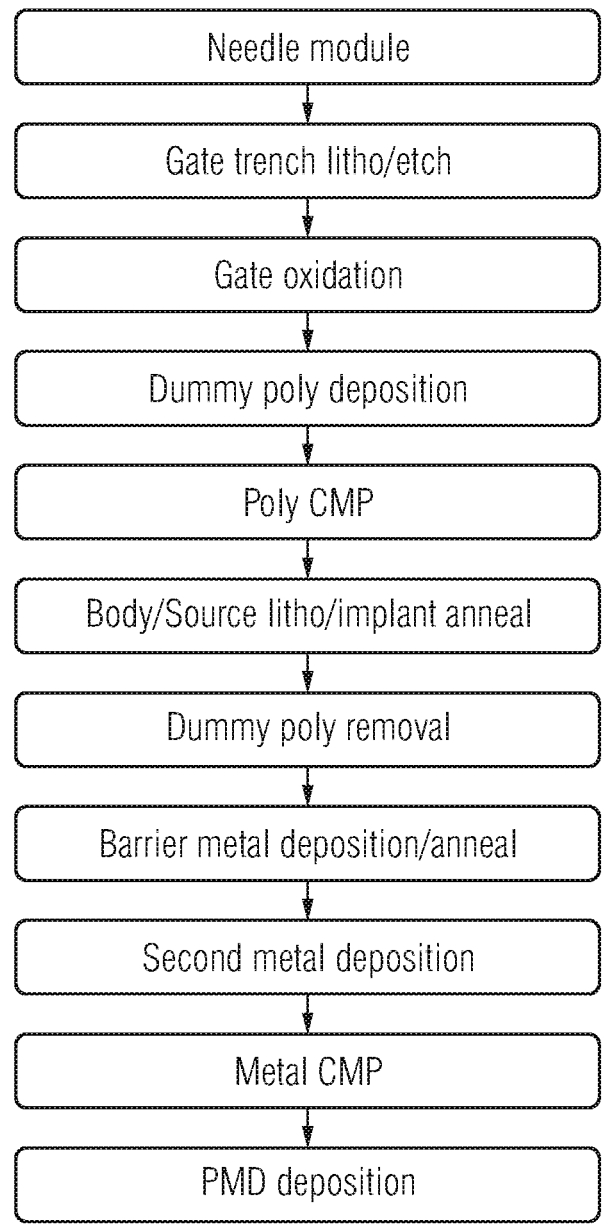

FIG. 5B illustrates a further embodiment. After forming the field plate trenches, defining the gate trenches 130 and forming a gate dielectric layer, a dummy material may be filled into the gate trenches 130. For example, the dummy material may comprise polysilicon. A CMP step may be performed so as to planarize the surface and to remove protruding dummy material portions. Thereafter, a doping process, e.g. an ion implantation step may be performed so as to form the body region and the source region. Usually, such a step is performed at a temperature of approximately 1000° C. Thereafter, the dummy material may be removed. Then the method shown in FIGS. 2A to 2E may be performed. The metal layer forming the gate electrode may be deposited in the gate trenches 130. A CMP step for removing a portion of the metal may be performed, followed the deposition of the power metal over the resulting surface. According to this sequence, a metal which does not withstand high temperatures, may be employed.

Figure 5C:
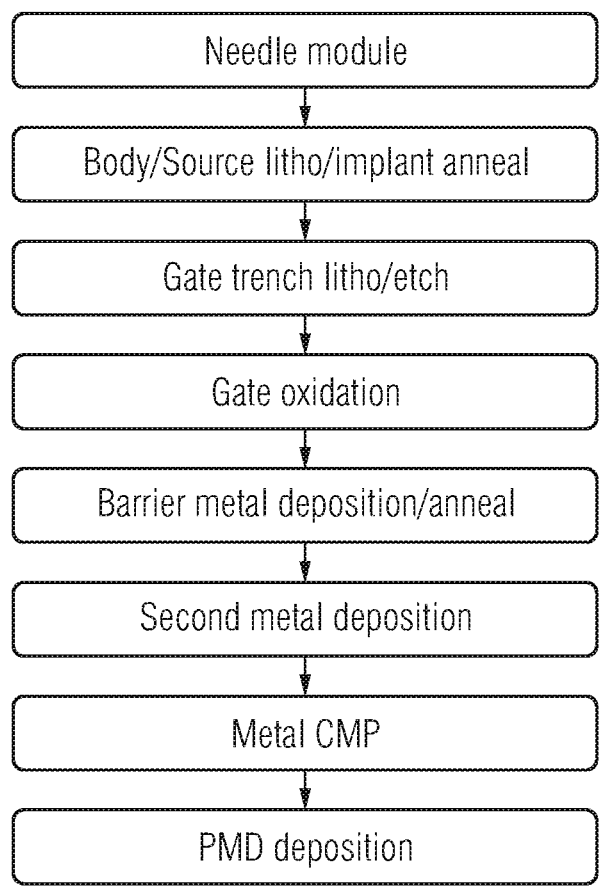

FIG. 5C further illustrates a further implementation of the method according to an embodiment. According to this implementation, a doping process for forming the body region and the source region is performed before forming the gate trenches 130 and forming the gate oxide layer. According to this embodiment, a reduced number of high temperature steps is performed after forming the gate electrode material. Accordingly, a metal which may not withstand very high temperatures may be used as the gate electrode material.

Figure 6A:
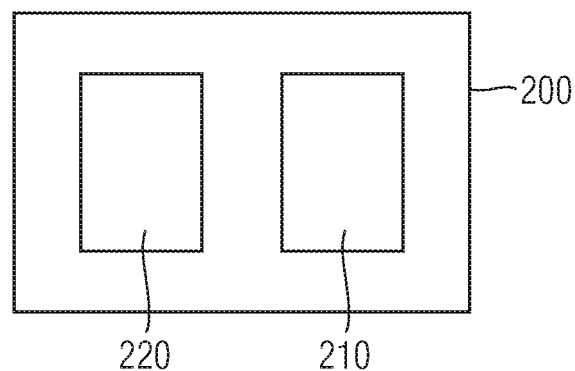
FIG. 6A shows a schematic view of a power IC according to an embodiment.

FIG. 6A shows an example of a power IC 200 according to an embodiment. The power IC 200 comprises a semiconductor device 210 such as shown in any of FIGS. 1A to 3B, and circuit elements 220 for implementing another function such as a logic circuit of the power IC. The circuit elements may comprise active and passive elements, for example, transistors, diodes, resistors, capacitors, inductors. For example, the semiconductor device 210 may be embedded in the power IC 200.

Other than an integrated circuit (IC), which consists of a few to billions of active devices manufactured and interconnected on a single semiconductor body, according to an embodiment, the semiconductor device may be implemented as a discrete semiconductor transistor. The discrete semiconductor transistor is a single transistor in the semiconductor body without any other active semiconductor elements interconnected thereto. Although passive components such as resistors, capacitors and inductors may be formed in and/or on the semiconductor body, the discrete semiconductor transistor is specified to perform an elementary electronic function. Although the discrete semiconductor transistor may include a large number of transistor cells, the discrete semiconductor transistor is specified to perform an elementary electronic function and is not divisible into separate components functional in themselves as is typical for integrated circuits. For example, the semiconductor device described herein may be a discrete semiconductor transistor that is included in any power system including a power supply.

Figure 6B:
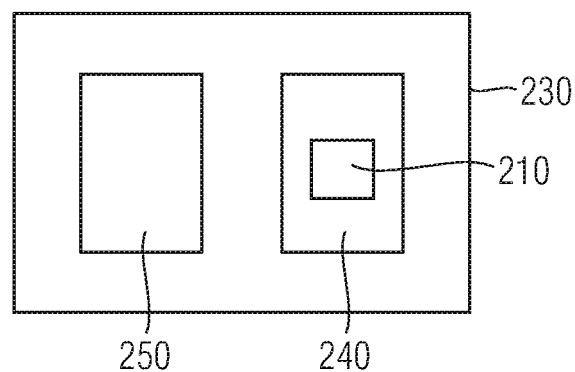
FIG. 6B shows a schematic view of a power supply and components thereof according to an embodiment.

FIG. 6B shows an example of a power supply which may comprise the semiconductor device as has been described herein above. In particular, the power supply 230 may comprise a synchronous rectifier 240 such as a buck converter. The synchronous rectifier 240 may comprise the semiconductor device 210 that has been described herein above. The power supply may further comprise further power supply components 250. As has been described above, the semiconductor device 210 shows reduced overvoltage spikes and lower switching losses. Hence, such a semiconductor device 210 may be used in an synchronous rectification device such as a buck converter. The further power supply components may comprise several controllers and drivers and further active or passive elements which are commonly used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a power metal oxide semiconductor field effect transistor, the method comprising:
   forming a gate electrode in a gate trench in a main surface of a semiconductor substrate, the gate trench extending parallel to the main surface, the gate electrode comprising a gate electrode material, the gate electrode material comprising a metal;
   forming a field electrode in a field plate trench in the main surface, the field plate trench having an extension length in a first direction which is less than double and more than half of an extension length of the field plate trench in a second direction perpendicular to the first direction, the first and the second directions being parallel to the main surface;
   forming a source region adjacent to the main surface;
   forming a drain region adjacent to a backside surface of the semiconductor substrate opposite the main surface; and
   forming a body region adjacent to the gate electrode,
   wherein forming the gate electrode comprises filling a dummy material into the gate trench, and
   wherein forming the source, drain and body regions is performed after filling the dummy material into the gate trench.

2. The method of claim 1, wherein forming the gate electrode in the gate trench comprises forming a layer stack of a first and a second metal layer, the first metal layer being adjacent to a gate dielectric.

3. The method of claim 2, wherein the first metal layer is a metal nitride.

4. The method of claim 2, wherein the second metal layer is tungsten or a silicide containing polysilicon layer.

5. The method of claim 1, wherein a width of the gate trench measured perpendicularly to the first direction is less than 500 nm.

6. The method of claim 1, further comprising:
   forming a drift zone between the body region and the drain region.

7. The method of claim 1, further comprising:
   removing the dummy material from the gate trench after forming the source and the drain regions; and
   filling the gate electrode material into the gate trenches after removing the dummy material from the gate trench.

8. The method of claim 1, further comprising:
   forming a plurality of field plate trenches arranged along the first direction between two adjacent gate trenches.

9. The method of claim 1, further comprising:
   forming a plurality of transistor cells configured to be controlled by the gate electrode.

10. The method of claim 1, wherein a width of the gate trench measured perpendicularly to the first direction is smaller than a width of the field plate trench measured perpendicularly to the first direction.

11. The method of claim 1, further comprising:
   forming a gate dielectric in the gate trench that separates the gate electrode from the semiconductor substrate, the gate dielectric having a thickness of 20 to 100 nm.

12. A method of manufacturing a power metal oxide semiconductor field effect transistor, the method comprising:

forming a gate electrode in a gate trench in a main surface of a semiconductor substrate, the gate trench extending parallel to the main surface, the gate electrode comprising a gate electrode material, the gate electrode material comprising a metal; and forming a field electrode in a field plate trench in the main surface, the field plate trench being separate from the gate trench and having an extension length parallel to the main surface which is less than a depth of the field plate trench, forming a source region adjacent to the main surface;

forming a drain region adjacent to a backside surface of the semiconductor substrate opposite the main surface; and forming a body region adjacent to the gate electrode, wherein forming the gate electrode comprises filling a dummy material into the gate trench, and wherein forming the source, drain and body regions is performed after filling the dummy material into the gate trench.

13. The method of claim 12, wherein the extension length of the field plate trench is less than 0.2 times the depth of the field plate trench.

14. A method of manufacturing a power metal oxide semiconductor field effect transistor, the method comprising:

forming first and second elongated gate trenches in a main surface of a semiconductor substrate, the first and second elongated gate trenches being parallel to one another and extending lengthwise in a first direction that is parallel to the main surface, wherein two immediately adjacent ones of the first and second elongated gate trenches are separated from one another by an elongated section of the semiconductor substrate that extends lengthwise in the first direction, forming first and second field plate trenches in the elongated section of the semiconductor substrate, the first field plate trench being separated from the second field plate trench by a portion of the elongated section of the semiconductor substrate that extends in the first direction from the first field plate trench to the second field plate trench;

forming gate electrodes that comprise electrically conductive gate electrode material in the first and second gate trenches;

forming field plates that comprise electrically conductive field plate material in the first and second field plate trenches;

forming a source region adjacent to the main surface; and forming a drain region adjacent to a backside surface of the semiconductor substrate opposite the main surface;

wherein the gate electrode material is formed after forming the source and the drain regions, wherein forming the gate electrode comprises filling a dummy material into the gate trench, and wherein forming the source and the drain regions is performed after filling the dummy material into the gate trench.

15. The method of claim 14, wherein the first and second field plate trenches are each formed to have an extension length in the first direction which is less than double of an extension length of the first and second field plate trenches in a second direction, the second direction being perpendicular to the first direction and parallel to the main surface.

16. The method of claim 14, further comprising:

removing the dummy material from the gate trench after forming the source and the drain regions; and filling the gate electrode material into the gate trenches after removing the dummy material from the gate trench.

* * * * *